(12) United States Patent
Sato et al.

(10) Patent No.: US 11,430,675 B2
(45) Date of Patent: Aug. 30, 2022

(54) SUBSTRATE PROCESSING APPARATUS AND PROCESSING LIQUID REUSE METHOD

(71) Applicant: Tokyo Electron Limited, Tokyo (JP)

(72) Inventors: Hideaki Sato, Kumamoto (JP); Junichi Kitano, Kumamoto (JP); Kouzou Kanagawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/438,580

(22) Filed: Jun. 12, 2019

(65) Prior Publication Data
US 2019/0385869 A1 Dec. 19, 2019

(30) Foreign Application Priority Data

Jun. 15, 2018 (JP) .............................. JP2018-114963

(51) Int. Cl.
*H01L 21/67* (2006.01)

(52) U.S. Cl.
CPC .. *H01L 21/67086* (2013.01); *H01L 21/67017* (2013.01); *H01L 21/67063* (2013.01); *H01L 21/67075* (2013.01)

(58) Field of Classification Search
CPC ......... H01L 21/67017; H01L 21/67023; H01L 21/67063; H01L 21/67075; H01L 21/6708; H01L 21/67086
See application file for complete search history.

(56) References Cited

U.S. PATENT DOCUMENTS

| | | | | |
|---|---|---|---|---|
| 6,200,414 B1* | 3/2001 | Hwang | ................. | B24B 37/015 156/345.18 |
| 7,238,295 B2* | 7/2007 | Izuta | ........................ | C23F 1/46 216/83 |
| 7,964,108 B2* | 6/2011 | Izuta | ...................... | C09K 13/04 216/93 |
| 2007/0102023 A1* | 5/2007 | Yi | ............................ | B08B 3/08 134/10 |
| 2015/0221530 A1* | 8/2015 | Hara | ................. | H01L 21/67023 134/18 |

FOREIGN PATENT DOCUMENTS

| | | |
|---|---|---|
| JP | S61-051928 A | 3/1986 |
| JP | H09-275091 A | 10/1997 |
| JP | 2013-093478 A | 5/2013 |
| JP | 2013-165217 A | 8/2013 |
| JP | 2017-216478 A | 12/2017 |

* cited by examiner

*Primary Examiner* — Benjamin Kendall
*Assistant Examiner* — Kurt Sweely
(74) *Attorney, Agent, or Firm* — Venjuris, P.C.

(57) ABSTRACT

A substrate processing apparatus includes a processing tank, a reservoir, a remover, a mixer, and a return path. Etching is performed on a substrate in the processing tank by immersing the substrate in a processing liquid containing a chemical liquid and silicon. The reservoir recovers and stores the processing liquid discharged from the processing tank. The remover recovers a portion of the processing liquid discharged from the processing tank, and removes silicon from the recovered processing liquid. The mixer mixes the processing liquid stored in the reservoir with the processing liquid from which silicon has been removed by the remover. The processing liquid mixed by the mixer is returned to the processing tank through a return path.

13 Claims, 9 Drawing Sheets

SUBSTRATE PROCESSING APPARATUS AND PROCESSING LIQUID REUSE METHOD

CROSS-REFERENCE TO RELATED APPLICATION

This application is based on and claims priority from Japanese Patent Application No. 2018-114963, filed on Jun. 15, 2018 with the Japan Patent Office, the disclosure of which is incorporated herein in its entirety by reference.

TECHNICAL FIELD

The present disclosure relates to a substrate processing apparatus and a processing liquid reuse method.

BACKGROUND

There has been known a technique of etching a substrate such as, for example, a semiconductor wafer by immersing the substrate in a processing liquid. For example, Japanese Patent Laid-Open Publication No. 2013-093478 discloses a technique of etching a nitride film formed on the surface of a substrate by immersing the substrate in a phosphoric acid aqueous solution.

When etching processes of substrates are repeatedly performed using a phosphoric acid aqueous solution, the silicon concentration increases in the phosphoric acid aqueous solution, and a selection ratio between a silicon oxide film and a silicon nitride film changes, which makes it difficult to favorably perform the etching processing on the substrate. For this reason, in the technique described in Japanese Patent Laid-Open Publication No. 2013-093478, the silicon concentration of a processing liquid in a processing tank is adjusted to a desired concentration by discarding a portion of the processing liquid stored in the processing tank and replenishing the processing tank with a new phosphoric acid aqueous solution in an amount corresponding to the discarded amount.

SUMMARY

A substrate processing apparatus according to an aspect of the present disclosure includes a processing tank, a reservoir, a remover, a mixer, and a return path. In the processing tank, etching is performed on a substrate by immersing the substrate in a processing liquid containing a chemical liquid and silicon. The reservoir recovers and stores the processing liquid discharged from the processing tank. The remover recovers a portion of the processing liquid discharged from the processing tank, and removes silicon from the recovered processing liquid. The mixer mixes the processing liquid stored in the reservoir with the processing liquid from which silicon has been removed by the remover. The return path returns the processing liquid mixed by the mixer to the processing tank.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
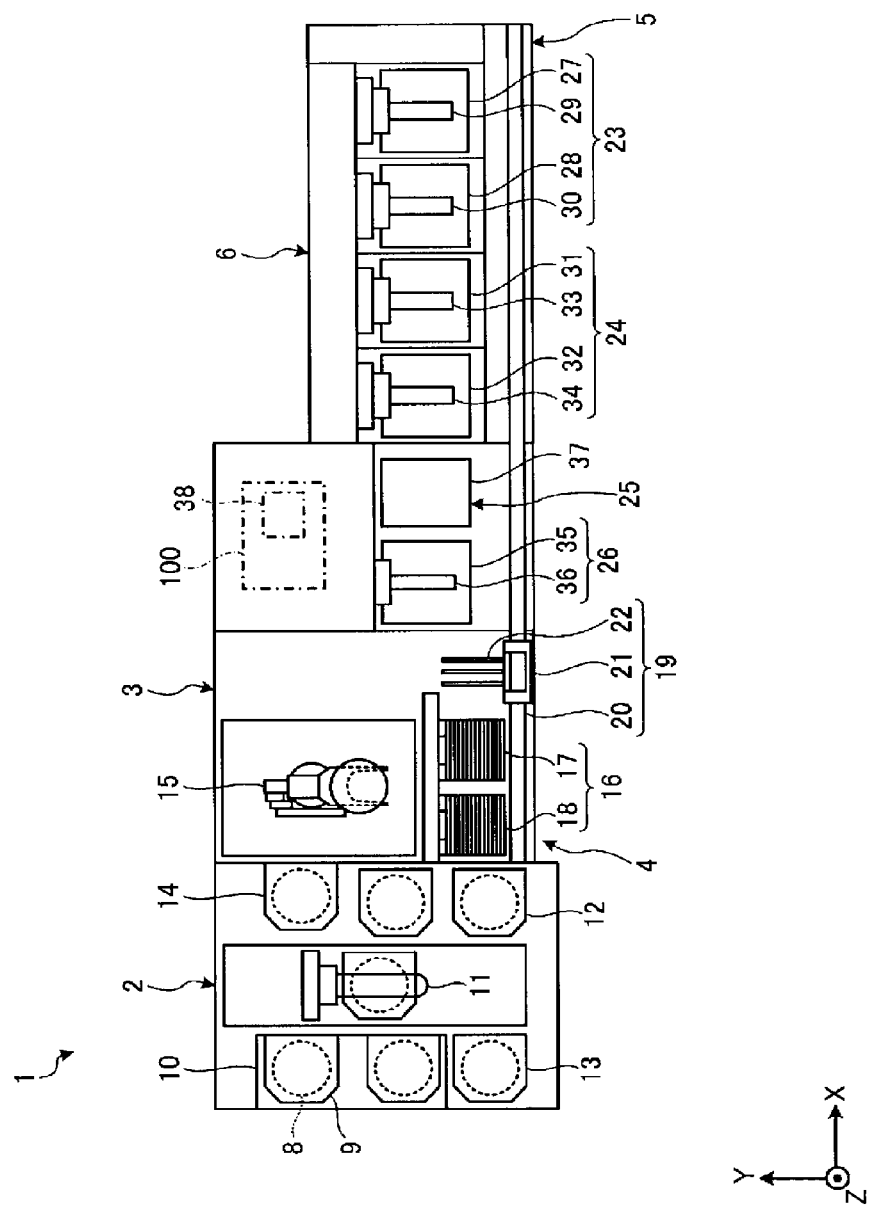
FIG. 1 is a view illustrating a configuration of a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, modes for carrying out a substrate processing apparatus and a processing liquid reuse method according to the present disclosure (hereinafter, referred to as "embodiments") will be described in detail with reference to the accompanying drawings. In addition, the substrate processing apparatus and the processing liquid reuse method according to the present disclosure are not limited by these embodiments. Respective embodiments may be appropriately combined as long as the processing contents do not contradict each other. In each of the following embodiments, the same components are denoted by the same reference numerals, and duplicate descriptions are omitted.

There has been known a processing in which, of a nitride film (SiN) and an oxide film ($SiO_2$) formed on a substrate, only the nitride film is selectively etched.

In the etching of the silicon nitride film, a processing liquid obtained by adding a silicon (Si)-containing compound (which may be simply referred to as "silicon" below) to a chemical liquid is used. The chemical liquid is, for example, a phosphoric acid ($H_3PO_4$) aqueous solution. The silicon concentration in the processing liquid is adjusted, for example, by immersing a dummy substrate in a phosphoric acid aqueous solution to dissolve silicon on the dummy substrate in the phosphoric acid aqueous solution.

It has been known that the silicon concentration in a processing liquid is increased by repeating the etching processing. When the silicon concentration in the processing liquid is increased, the selection ratio between the silicon oxide film and the silicon nitride film is changed, which may make it impossible to favorably perform etching on a substrate. For this reason, a processing of adjusting the concentration of the processing liquid in the processing tank is performed as needed by discarding a portion of the processing liquid stored in the processing tank and replenishing the processing tank with an amount of phosphoric acid aqueous solution corresponding to the discarded amount.

However, in order to reduce the consumption of the processing liquid, it is desirable not to discard the processing liquid as much as possible. Therefore, it is expected to reduce the discarded amount of the processing liquid.

[Configuration of Substrate Processing Apparatus]

First, a configuration of a substrate processing apparatus according to an embodiment will be described with reference to FIG. 1. FIG. 1 is a view illustrating a configuration of a substrate processing apparatus according to an embodiment. In the following description, in order to clarify a positional relationship, an X axis, a Y axis, and a Z axis orthogonal to each other are defined, and the Z-axis positive direction is defined as a vertical upward direction.

As illustrated in FIG. 1, a substrate processing apparatus 1 according to an embodiment includes a carrier carry-in/out section 2, a lot forming section 3, a lot placement section 4, a lot transport section 5, a lot processing section 6, and a controller 100.

The carrier carry-in/out section 2 is configured to perform carry-in/out of a carrier 9 containing a plurality of (e.g., 25) substrates (silicon wafers) 8 aligned vertically in a horizontal posture.

The carrier carry-in/out section 2 is provided with a carrier stage 10 on which a plurality of carriers 9 are placed, a carrier transport mechanism 11 configured to transport the carriers 9, carrier stocks 12, 13 configured to temporarily store the carriers 9 therein, and a carrier placement table 14 configured to place a carrier 9 thereon.

The carrier carry-in/out section 2 is configured to transport a carrier 9 carried from the outside into the carrier stage 10 to the carrier stock 12 or the carrier placement table 14 using the carrier transport mechanism 11. That is, the carrier carry-in/out unit 2 transports a carrier 9 containing a plurality of substrates 8 before being processed in the lot processing section 6 to the carrier stock 12 or the carrier placement table 14.

The carrier stock 12 temporarily stores the carrier 9 containing the plurality of substrates 8 to be processed in the lot processing section 6.

From the carrier 9 transported to the carrier placement table 14 and containing the plurality of substrates 8 to be processed in the lot processing section 6, the plurality of substrates 8 are carried out by a substrate transport mechanism 15 which will be described later.

In addition, a plurality of substrates 8 processed in the lot processing section 6 are carried into a carrier 9 placed on the carrier placement table 14 and containing no substrate 8, from the substrate transport mechanism 15.

The carrier carry-in/out section 2 is configured to transport the carrier 9 placed on the carrier placement table 14 and containing the plurality of substrates 8 processed in the lot processing section 6 to the carrier stock 13 or the carrier stage 10 using the carrier transport mechanism 11.

The carrier stock 13 temporarily stores the plurality of substrates 8 processed in the lot processing section 6. The carrier 9 transported to the carrier stage 10 is carried out to the outside.

The lot forming section 3 is provided with the substrate transport mechanism 15 configured to transport a plurality of (e.g., 25) substrates 8. In the lot forming section 3, a lot composed of a plurality of (e.g., 50) substrates 8 is formed by transporting a plurality of (e.g., 25) substrates 8, for example, twice by the substrate transport mechanism 15.

In the lot forming section 3, a lot is formed by transporting a plurality of substrates 8 from the carrier 9 placed on the carrier placement table 14 to the lot placement section 4 using the substrate transport mechanism 15, and placing the plurality of substrates 8 in the lot placement section 4.

The plurality of substrates 8 forming the lot are simultaneously processed by the lot processing section 6. When forming a lot, the lot may be formed such that the pattern-formed surfaces of the substrates 8 face each other, or may be formed such that all the pattern-formed surfaces of the substrates 8 are oriented in one direction.

In addition, in the lot forming section 3, a plurality of substrates 8 are transported from a lot processed in the lot processing section 6 and placed in the lot placement section 4 to a carrier 9 using the substrate transport mechanism 15.

The substrate transport mechanism 15 includes two kinds of substrate supports (not illustrated) configured to a plurality of substrates 8, that is, a to-be-processed substrate support (not illustrated) configured to support a plurality of to-be-processed substrates 8 and a processed substrate support (not illustrated) configured to support a plurality of processed substrates 8. This makes it possible to prevent, for example, particles attached to, for example, the to-be-processed substrates 8 from being transferred to, for example, a plurality of processed substrates 8.

The substrate transport mechanism 15 changes the posture of the plurality of substrates 8 from the horizontal posture to the vertical posture and from the vertical posture to the horizontal posture in the middle of transport of the plurality of substrates 8. The horizontal posture refers to the state in which the substrates 8 are laid down, and the vertical posture refers to the state in which the substrates 8 are erected.

In the lot placement section 4, a lot transported between the lot forming section 3 and the lot processing section 6 by the lot transport section 5 is temporarily placed (stands by) on the lot placement table 16.

In the lot placement section 4, a carry-in side lot placement table 17 and a carry-out side lot placement table 18 are provided.

A to-be-processed lot is placed on the carry-in side lot placement table 17. A processed lot is placed on the carry-out side lot placement table 18.

In each of the carry-in side lot placement table 17 and the carry-out side lot placement table 18, a plurality of substrates 8 for one lot are arranged side by side in the vertical posture in the front and rear.

The lot transport section 5 transport lots between the lot placement section 4 and the lot processing section 6 or between internal portions of the lot processing section 6.

The lot transport section 5 is provided with a lot transport mechanism 19 configured to transport a lot. The lot transport mechanism 19 includes a rail 20 disposed along the lot placement section 4 and the lot processing section 6 and a moving body 21 configured to move along the rail 20 while holding a lot.

The moving body 21 is provided with a substrate holder 22 configured to hold a lot formed of a plurality of substrates 8 arranged side by side in the vertical posture in the front and rear.

The lot transport section 5 receives a lot placed on the carry-in side lot placement table 17 using the substrate holder 22 of the lot transport mechanism 19, and delivers the received lot to the lot processing section 6.

In addition, the lot transport section 5 receives a lot processed in the lot processing section 6 using the substrate holder 22 of the lot transport mechanism 19, and delivers the received lot to the carry-out side lot placement table 18.

Further, the lot transport section 5 transports a lot within the lot processing section 6 using the lot transport mechanism 19.

The lot processing section 6 performs processings such as, for example, etching, cleaning, and drying on a lot formed of a plurality of substrates 8 arranged side by side in the vertical posture in the front and rear.

The lot processing section 6 includes an etching apparatus 23 configured to etch the lot, a cleaning apparatus 24 configured to clean the lot, a substrate holder cleaning apparatus 25 configured to clean the substrate holder 22, and a drying apparatus 26 configured to dry the lot, which the etching apparatus 23, the cleaning apparatus 24, the substrate holder cleaning apparatus 25, and the drying apparatus 26 are provided side by side. The number of etching apparatuses 23 is not limited to one, and may be two or more.

The etching apparatus 23 includes an etching processing tank 27, a rinsing processing tank 28, and substrate holders 29, 30.

In the etching processing tank 27, a processing liquid for etching is stored. In the rinsing processing tank 28, a processing liquid for rinsing (e.g., pure water) is stored. Details of the etching processing tank 27 will be described later.

The substrate holders 29, 30 hold a plurality of substrates 8 forming a lot side by side in the vertical posture in the front and rear.

The etching apparatus 23 receives a lot from the substrate holder 22 of the lot transport mechanism 19 using the substrate holder 29 and lowers the received lot by lowering the substrate holder 29 so as to immerse the lot in the processing liquid of the processing tank 27, thereby performing etching.

Thereafter, the etching apparatus 23 takes out the lot from the processing tank 27 by raising the substrate holder 29, and delivers the lot from the substrate holder 29 to the substrate holder 22 of the lot transport mechanism 19.

Then, the lot from the substrate holder 22 of the lot transport mechanism 19 is received using the substrate holder 30, and the received lot is immersed in the processing liquid for rinsing in the processing tank 28 by lowering the substrate holder 30 so as to perform etching.

Thereafter, the etching apparatus 23 takes out the lot from the processing tank 28 by raising the substrate holder 30, and delivers the lot from the substrate holder 30 to the substrate holder 22 of the lot transport mechanism 19.

The cleaning apparatus 24 includes a cleaning processing tank 31, a rinsing processing tank 32, and substrate holders 33, 34.

In the cleaning processing tank 31, a processing liquid for cleaning (e.g., SC1) is stored. In the rinsing processing tank 32, a processing liquid for rinsing (e.g., pure water) is stored. The substrate holders 33, 34 hold a plurality of substrates 8 of one lot side by side in the vertical posture in the front and rear.

The drying apparatus 26 has a processing tank 35 and a substrate holder 36 configured to move up and down with respect to the processing tank 35.

A processing gas for drying (e.g., isopropyl alcohol (IPA)) is supplied to the processing tank 35. The substrate holder 36 hold a plurality of substrates 8 of one lot side by side in the vertical posture in the front and rear.

The drying apparatus 26 receives a lot from the substrate holder 22 of the lot transport mechanism 19 using the substrate holder 36, loads the lot into the processing tank 35 by lowering the substrate holder 36, and performs drying of the lot using a processing gas for drying which is supplied to the processing tank 35. Then, the drying apparatus 26 raises the lot by the substrate lifting mechanism 36, and delivers the lot subjected to the drying from the substrate holder 36 to the substrate holder 22 of the lot transport mechanism 19.

The substrate holder cleaning apparatus 25 is configured to be able to supply a processing liquid for cleaning and a drying gas to the processing tank 37. After supplying the processing liquid for cleaning to the substrate holder 22 of the lot transport mechanism 19, the cleaning of the substrate holder 22 is performed by supplying the drying gas.

The controller 100 controls the operations of respective sections (the carrier carry-in/carry-out section 2, the lot forming section 3, the lot placement section 4, the lot transport section 5, and the lot processing section 6) of the substrate processing apparatus 1. The controller 100 controls the operations of respective sections of the substrate processing apparatus 1 based on signals from, for example, a switch.

The controller 100 includes a microcomputer or various circuits including, for example, a central processing unit (CPU), a read only memory (ROM), a random-access memory (RAM), and an input/output port. The controller 100 has a computer-readable storage medium 38. In the storage medium 38, a program for controlling various processings executed in the substrate processing apparatus 1 is stored.

The controller 100 controls the operations of the substrate processing apparatus 1 by executing the program stored in the storage medium 38 by the CPU using the ROM as a work area. In addition, the program may have been stored in the computer-readable storage medium 38 and installed from another storage medium to the storage medium 38 of the controller 100.

The computer-readable storage medium 38 may be, for example, a hard disk (HD), a flexible disk (FD), a compact disk (CD), a magneto-optical disk (MO), or a memory card.

[Configuration of Processing Tank]

Figure 2:
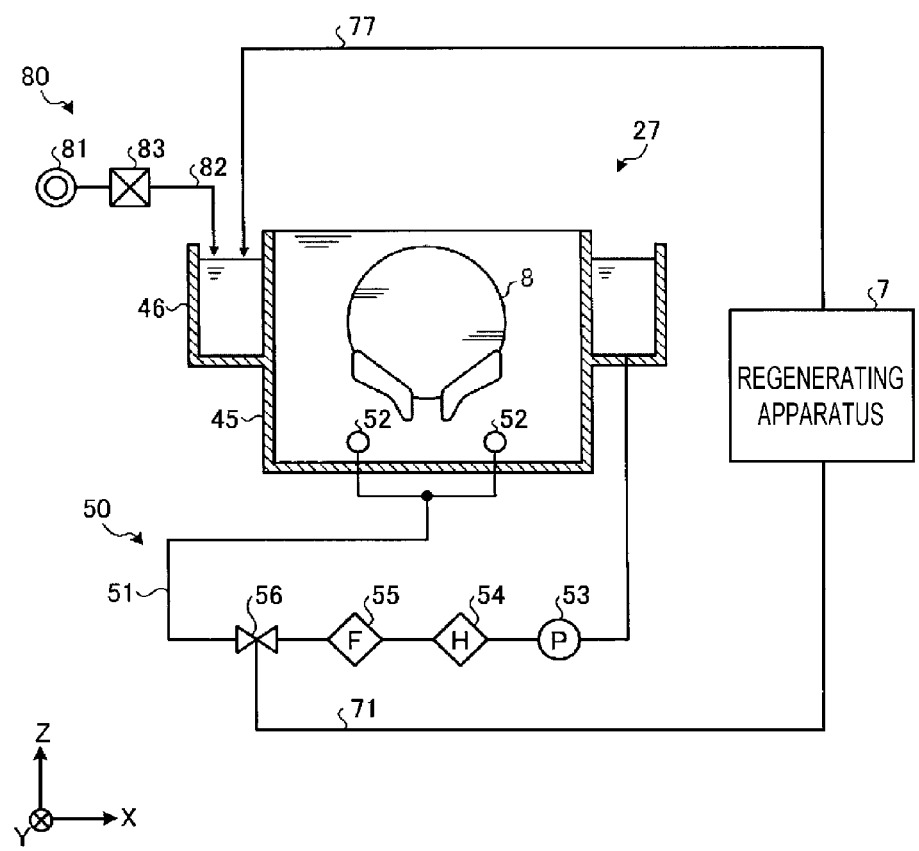
FIG. 2 is a view illustrating a configuration of an etching processing tank according to the embodiment.

Next, the configuration of the etching processing tank 27 will be described with reference to FIG. 2. FIG. 2 is a view illustrating the configuration of the etching processing tank 27 according to the embodiment.

In the etching processing tank 27, a processing in which, of a nitride film (SiN) and an oxide film ($SiO_2$) formed on the substrate 8, only the nitride film is selectively etched, is performed by immersing a substrate 8 in a processing liquid containing a chemical liquid and silicon. The chemical liquid is, for example, a phosphoric acid aqueous solution.

The processing tank 27 includes an inner tank 45 and an outer tank 46. In addition, the processing tank 27 includes a circulator 50 and a pure water supply 80.

The inner tank 45 is open at the top thereof, and stores the processing liquid therein. The lot (a plurality of substrates 8) is immersed in the inner tank 45.

The outer tank 46 is open at the top thereof and is disposed around the upper portion of the inner tank 45. The processing liquid overflowing from the inner tank 45 flows into the outer tank 46.

Pure water is supplied to the outer tank 46 from the pure water supply 80. The pure water supply 80 supplies pure water (deionized water (DIW)) to the outer tank 46 in order to replenish the water evaporated from the processing liquid by heating.

In addition, the outer tank 46 is supplied with the processing liquid recovered from the processing tank 27 and regenerated by a regenerating apparatus 7 described later.

The regenerating apparatus 7 adjusts the silicon concentration in the processing liquid recovered from the processing tank 27 through a recovery path 71 to a predetermined desired concentration, and then returns the adjusted processing liquid through the return path 77. The configuration of the regenerating apparatus 7 will be described later.

The circulator 50 circulates the processing liquid between the inner tank 45 and the outer tank 46. The circulator 50 includes a circulation path 51, a processing liquid supply nozzle 52, a pump 53, a heater 54, a filter 55, and a switching valve 56.

The circulation path 51 connects the outer tank 46 and the inner tank 45. One end of the circulation path 51 is connected to the outer tank 46, and the other end of the circulation path 51 is connected to the processing liquid supply nozzle 52 disposed in the inner tank 45.

The pump 53, the heater 54, and the filter 55 are provided in the circulation path 51. The pump 53 sends the processing liquid in the outer tank 46 to the circulation path 51. The heater 54 heats the processing liquid flowing in the circulation path 51 to a temperature suitable for etching. For example, the heater 54 heats the processing liquid to a temperature at which the processing liquid boils. The filter 55 removes impurities from the processing liquid flowing in the circulation path 51. The switching valve 56 switches the outflow destination of the processing liquid between the circulation path 51 and the recovery path 71 described later. The pump 53, the heater 54, the filter 55, and the switching valve 56 are provided in this order from the upstream side.

The circulator 50 sends the processing liquid from the outer tank 46 into the inner tank 45 via the circulation path 51. The processing liquid sent to the inner tank 45 overflows from the inner tank 45 and flows out to the outer tank 46 again. Thus, the processing liquid circulates between the inner tank 45 and the outer tank 46.

The pure water supply 80 includes a pure water supply source 81, a pure water return path 82, and a flow rate regulator 83. The pure water supply source 81 is a tank that stores pure water. The pure water return path 82 connects the pure water supply source 81 and the outer tank 46 and supplies the pure water from the pure water supply source 81 to the outer tank 46. The flow rate regulator 83 includes, for example, an opening/closing valve, a flow rate control valve, and a flow meter, and regulates the flow rate of the pure water supplied from the pure water supply source 81 to the outer tank 46.

The pump 53 and the heater 54 are controlled by the controller 100. Further, the opening/closing valve and the flow rate control valve that constitute the flow rate regulator 83 are controlled by the controller 100.

[Configuration of Regenerating Apparatus]

Figure 3:
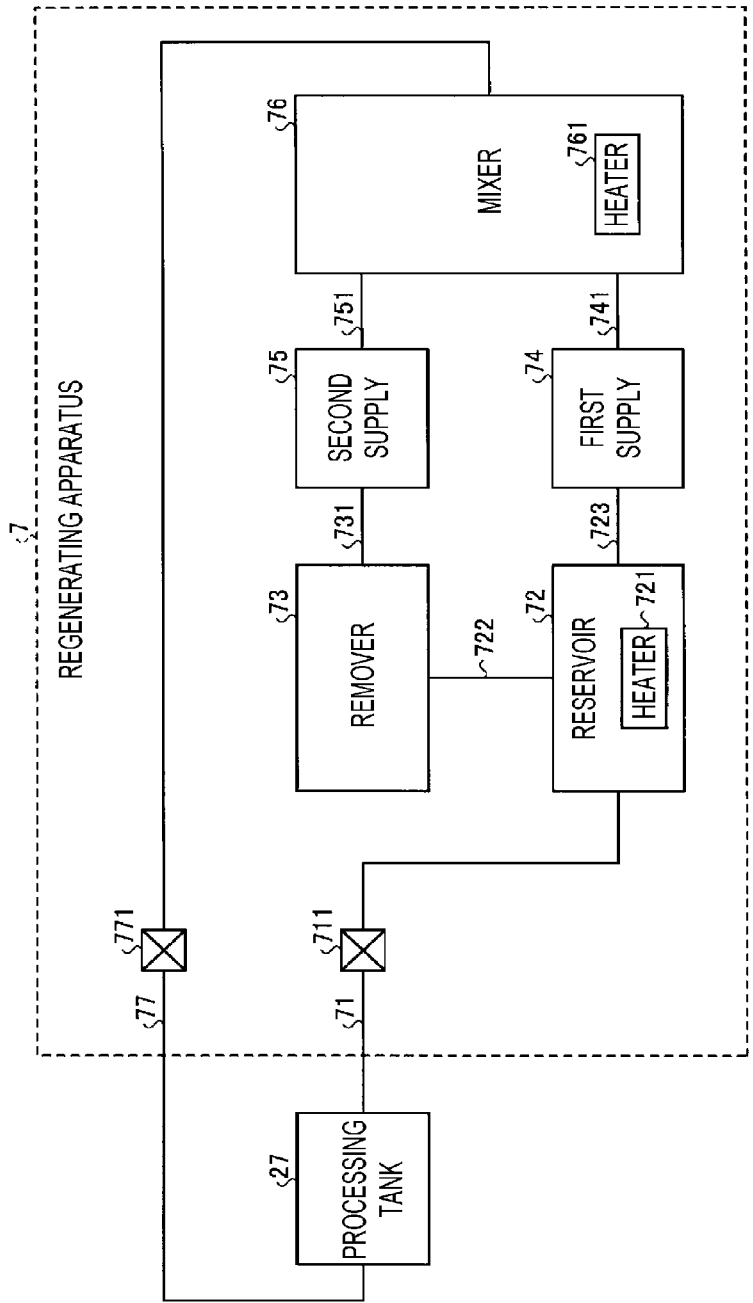
FIG. 3 is a view illustrating a configuration of a regenerating apparatus according to the embodiment.

Next, the configuration of the regenerating apparatus 7 will be described with reference to FIG. 3. FIG. 3 is a view illustrating a configuration of a regenerating apparatus according to the embodiment.

As illustrated in FIG. 3, the regenerating apparatus 7 includes a recovery path 71, a reservoir 72, a remover 73, a first supply 74, a second supply 75, a mixer 76, and a return path 77.

The recovery path 71 is a flow path for recovering the processing liquid used in the processing tank 27. One end of the recovery path 71 is connected to, for example, the switching valve 56 of the circulator 50 (see, e.g., FIG. 2). In addition, without being limited to this, one end of the recovery path 71 may be connected to the inner tank 45 or the outer tank 46. The other end of the recovery path 71 is connected to the reservoir 72. An opening/closing valve 711 is provided in the middle of the recovery path 71.

The reservoir 72 is a container that recovers and stores the processing liquid discharged from the processing tank 27 via the recovery path 71. The reservoir 72 includes a heater 721, and heats the stored processing liquid to a predetermined temperature. For example, the heater 721 heats the processing liquid stored in the reservoir 72 to a temperature exceeding the deposition temperature of silicon. This may make it possible to suppress the deposition of silicon in the reservoir 72 according to the temperature decrease of the processing liquid.

The reservoir 72 is connected to the remover 73 through a first connection path 722. The first connection path 722 is provided with a pump (not illustrated), and a portion of the processing liquid stored in the reservoir 72 is supplied to the remover 73 through the first connection path 722 by the pump (not illustrated). In addition, the reservoir 72 is connected to the first supply 74 through the second connection path 723. The second connection path 723 is provided with a pump (not illustrated), and a portion of the processing liquid stored in the reservoir 72 is supplied to the first supply 74 by the pump (not illustrated).

The remover 73 performs a silicon removal processing of recovering a portion of the processing liquid discharged from the processing tank 27 and removing a portion of silicon contained in the processing liquid from the recovered processing liquid. In an embodiment, the remover 73 recovers a portion of the processing liquid discharged from the processing tank 27 through the reservoir 72 and the first connection path 722.

Any known technique may be used for the configuration of the remover 73. As an example, the remover 73 includes a circulation path, a heater that heats the processing liquid flowing in the circulation path, and a filter that removes silicon from the processing liquid flowing in the circulation path. The remover 73 configured as described above removes silicon from the processing liquid by circulating the processing liquid through the inside of the circulation path while heating the processing liquid using a heater and causing the processing liquid to repeatedly pass through the filter. The remover 73 is capable of adjusting the silicon concentration in the processing liquid after the removal process, for example, by adjusting the processing time.

The remover 73 reduces the silicon concentration in the processing liquid to at least a concentration lower than the initial value of the silicon concentration in the processing liquid in the processing tank 27. In addition, the remover 73 removes a portion of silicon contained in the processing liquid. That is, the remover 73 does not completely remove the silicon in the processing liquid.

The remover 73 is connected to the second supply 75 through the third connection path 731. The third connection path 731 is provided with a pump (not illustrated), and the processing liquid after the removal processing is supplied to the second supply 75 by the pump (not illustrated).

The first supply 74 supplies, to the mixer 76, a first amount of the processing liquid out of the processing liquid stored in the reservoir 72. For example, the first supply 74 is a container capable of storing the first amount of the processing liquid, and when the processing liquid supplied from the reservoir 72 through the second connection path 723 is stored by the first amount, the stored first amount of the processing liquid is supplied to the mixer 76 through the fourth connection path 741.

The second supply 75 supplies, to the mixer 76, a second amount of the processing liquid out of the processing liquid from which the silicon has been removed by the remover 73. For example, the second supply 75 is a tank capable of storing the second amount of the processing liquid, and when the processing liquid supplied from the remover 73 through the third connection path 731 is stored by the second amount, the stored second amount of the processing liquid is supplied to the mixer 76 through the fifth connection path 751.

The first supply 74 may be, for example, an opening/closing valve that opens and closes the fourth connection path 741. In this case, when the controller 100 opens the opening/closing valve as the first supply 74 for a predetermined time, it is possible to supply a predetermined amount of the processing liquid to the mixer 76. Alternatively, when it is determined that a predetermined amount of the processing liquid has been supplied to the mixer 76 based on the measurement result of a flow rate meter provided in the fourth connection path 741, the controller 100 may open and close the opening/closing valve as the first supply 74. Similarly, the second supply 75 may also be an opening/closing valve that opens and closes the fifth connection path 751. In this case, when the controller 100 opens the opening/closing valve as the second supply 75 for a predetermined time, it is possible to supply a predetermined amount of the processing liquid to the mixer 76. Alternatively, when it is determined that a predetermined amount of the processing liquid has been supplied to the mixer 76 based on the measurement result of a flow rate meter provided in the fifth connection path 751, the controller 100 may open and close the opening/closing valve as the second supply 75.

The mixer 76 is a container that mixes the processing liquid stored in the reservoir 72 with the processing liquid from which silicon has been removed by the remover 73. Specifically, the mixer 76 mixes the processing liquid supplied from the first supply 74 through the fourth connection path 741 and the processing liquid supplied from the second supply 75 through the fifth connection path 751. The mixer 76 includes a heater 761, and heats the stored processing liquid to a predetermined temperature. For example, the heater 761 heats the processing liquid stored in the mixer 76 to the same temperature as the heating temperature by the heater 54 (see, e.g., FIG. 2) included in the processing tank 27. This may make it possible to suppress the deposition of silicon in the mixer 76 according to the temperature decrease of the processing liquid. In addition, when the processing liquid mixed in the mixer 76 is supplied to the processing tank 27 through the return path 77, it is possible to suppress the temperature of the processing liquid in the processing tank 27 from being lowered by the processing liquid supplied from the return path 77.

The return path 77 is a flow path that returns the processing liquid mixed by the mixer 76 to the processing tank 27. One end of the return path 77 is connected to the mixer 76, and the other end of the return path 77 is connected to, for example, the outer tank 46 of the processing tank 27. An opening/closing valve 771 is provided in the middle of the return path 77.

[Regenerating Processing of Processing Liquid]

Figure 4:
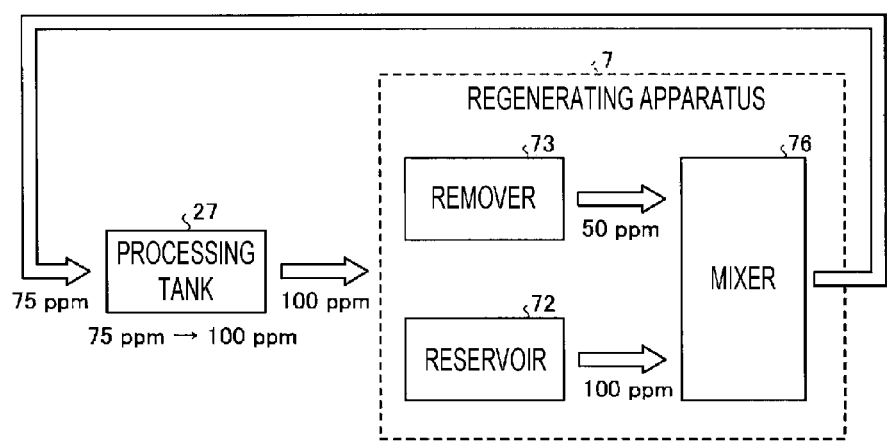
FIG. 4 is a view illustrating an exemplary regenerating processing according to the embodiment.

Next, the content of the regenerating processing of a processing liquid using the regenerating apparatus 7 will be described with reference to FIG. 4. FIG. 4 is a view illustrating an exemplary regenerating processing according to the embodiment. In FIG. 4, as an example, a case where the initial value of the silicon concentration in the processing liquid used in the processing tank 27 is 75 ppm will be described.

As illustrated in FIG. 4, the processing liquid is used in etching to increase the silicon concentration. Here, it is assumed that the silicon concentration in the processing liquid is increased from 75 ppm to 100 ppm. The controller 100 may calculate the value of silicon concentration after rising (here, 100 ppm), for example, from the relational expression between the number of processed substrates 8 or the processing time and the silicon concentration obtained through, for example, a test or simulation. In addition, the controller 100 may acquire the value of silicon concentration after rising from a concentration meter provided in the processing tank 27 or the regenerating apparatus 7 (at least one of the recovery path 71, the reservoir 72, the first connection path 722, and the remover 73).

The processing liquid in which the silicon concentration has increased to 100 ppm is supplied to the reservoir 72 via the recovery path 71 (see, e.g., FIG. 3), and is temporarily stored in the reservoir 72. In addition, a portion of the processing liquid having the silicon concentration of 100 ppm stored in the reservoir 72 is supplied to the remover 73 through the first connection path 722 (see, e.g., FIG. 3), and the silicon is removed by the remover 73. This reduces the silicon concentration in the processing liquid to less than 75 ppm. Here, it is assumed that the silicon concentration in the processing liquid is reduced from 100 ppm to 50 ppm by the remover 73.

The processing liquid having the silicon concentration of 100 ppm stored in the reservoir 72 and the processing liquid having the silicon concentration of 50 ppm from which silicon has been removed by the remover 73 are supplied to the mixer at a predetermined ratio by the first supply 74 and the second supply 75. As a result, the processing liquid having a concentration adjusted to a desired silicon concentration (here, the same as the initial concentration of the processing liquid in the processing tank 27) is generated. Then, the processing liquid having the silicon concentration adjusted to 75 ppm by the mixer 76 is supplied again to the processing tank 27 through the return path 77 (see, e.g., FIG. 3).

As described above, with the regenerating apparatus 7 according to the embodiment, the processing liquid is recovered from the processing tank 27, the silicon concentration in the recovered processing liquid is reduced to adjust the silicon concentration to the desired silicon concentration, and then the recovered processing liquid is returned to the processing tank 27. This may make it possible to reduce the amount of waste of the processing liquid compared to the method of adjusting the concentration of the processing liquid in the processing tank 27 by discarding a portion of the processing liquid in the processing tank 27 and replenishing a new processing liquid in an amount corresponding to the discarded amount to the processing tank 27, compared to the method of adjusting the concentration of the processing liquid in the processing tank 27.

In addition, the regenerating apparatus 7 according to the embodiment is capable of regenerating the processing liquid in a short time compared to, for example, a method of completely removing silicon from the processing liquid to set the silicon concentration to 0 ppm and then adding silicon to the processing liquid so as to increase the silicon concentration to a desired concentration. In addition, a mechanism for adding silicon to the processing liquid is not necessary, which is capable of contribute to the reduction of equipment.

In addition, the regenerating apparatus 7 according to the embodiment supplies a portion of the processing liquid discharged from the processing tank 27 to the remover 73, and the processing liquid recovered from the processing tank 27 and the remover and the processing liquid from which silicon has been removed by the remover 73 are mixed in the mixer 76. This makes it possible to regenerate the processing liquid in a short time compared to the case where the silicon removal processing by the remover 73 is performed on all the processing liquid recovered from the processing tank 27.

Modification

Figure 5:
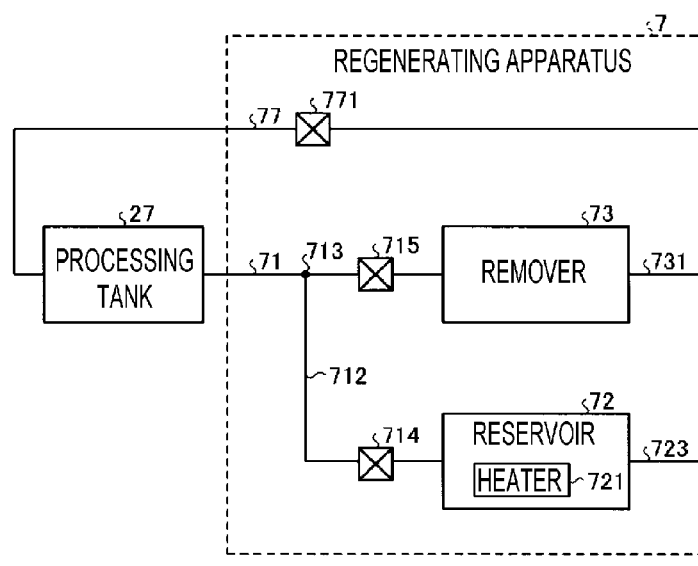
FIG. 5 is a view illustrating a configuration of a regenerating apparatus according to a first modification in the embodiment.

Next, a modification of the above-described regenerating apparatus 7 will be described. FIG. 5 is a view illustrating a configuration of a regenerating apparatus 7 according to a first modification in the embodiment.

In the embodiment described above, an example in which the other end of the recovery path 71 is connected to the reservoir 72 and a portion of the processing liquid stored in the reservoir 72 is supplied to the remover 73 through the first connection path 722 has been described. However, without being limited to this, the other end of the recovery path 71 may be connected to the remover 73, as illustrated in FIG. 5. In this case, the recovery path 71 may include, for example, a branch path 712 the other end of which is connected to the reservoir 72. This makes it possible to supply the processing liquid recovered from the recovery path 71 to the reservoir 72 and the remover 73 in parallel. In addition, the branch path 712 is provided with an opening/closing valve 714 that opens and closes the branch path 712. In addition, an opening/closing valve 715 that opens and closes the recovery passage 71 is provided downstream of a connection portion 713 with the branch path 712 in the recovery path 71.

In addition, the regenerating apparatus 7 may include a first recovery path that supplies the processing liquid recovered from the processing tank 27 to the reservoir 72, and a second recovery path that supplies the processing liquid recovered from the processing tank 27 to the remover 73, which may be provided independently of each other.

Figure 6:
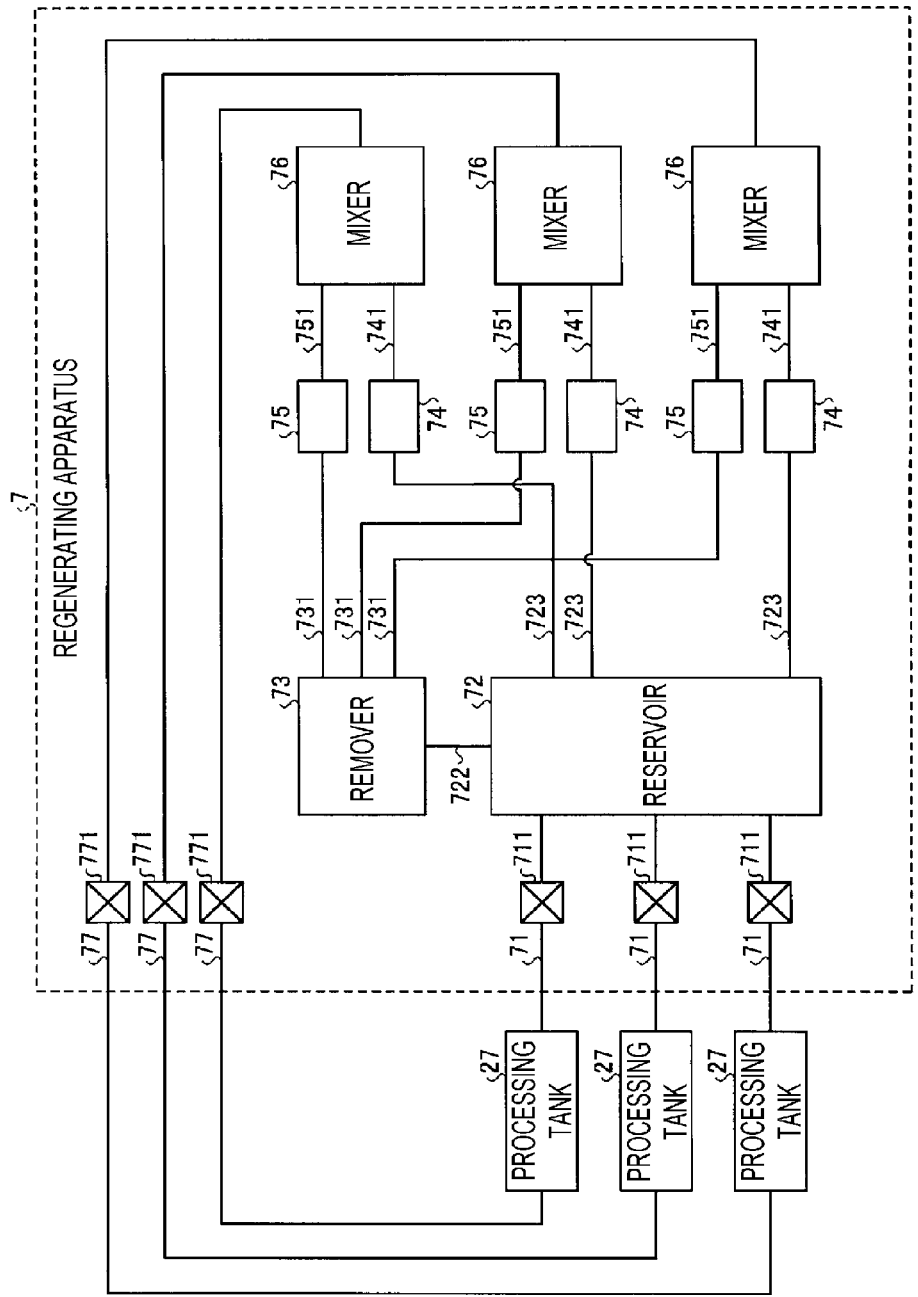
FIG. 6 is a view illustrating a configuration of a regenerating apparatus according to a second modification in the embodiment.

Next, a second modification will be described. FIG. 6 is a view illustrating a configuration of a regenerating apparatus 7 according to a second modification in the embodiment. In the embodiment described above, an in which the substrate processing apparatus 1 includes one processing tank 27 has been described. However, the substrate processing apparatus 1 may include a plurality of processing tanks 27.

As illustrated in FIG. 6, the regenerating apparatus 7 according to the second modification includes, for a plurality of processing tanks (here, three processing tanks) 27, one reservoir 72, one remover 73, and a plurality of first supplies (here, three first supplies) 74, a plurality of second supplies (here, three second supplies) 75, and a plurality of mixers (here, three mixers) 76.

The reservoir 72 is connected to the processing tanks 27 through a plurality of recovery paths 71, and the processing liquid used in the processing tanks 27 is supplied to the reservoir 72 through the recovery paths 71. In addition, the reservoir 72 is connected to the first supplies 74 via through a plurality of second connection paths 723, and the processing liquid stored in the reservoir 72 is supplied to the first supplies 74 through the second connection paths 723.

A portion of the processing liquid stored in the processing tank 27 is supplied to the remover 73 through a first connection path 722. The remover 73 is connected to the second supplies 75 through a plurality of third connection paths 731, and the processing liquid from which silicon has been removed by the remover 73 is supplied to the second supplies 75 through the third connection paths 731.

The first supplies 74, the second supplies 75, and the mixers 76 are provided corresponding to the processing tanks 27, respectively. Each first supply 74 is connected to a mixer 76 corresponding to the same processing tank 27 through a fourth connection path 741, and each second supply 75 is connected to a mixer 76 corresponding to the same tank 27 through a fifth connection path 751. Each mixer 76 mixes the processing liquid supplied from the fourth connection path 741 and the processing liquid supplied from the fifth connection path 751, and supplies the mixed processing liquid to the corresponding processing tank 27 through a return path 77.

The ratio of the processing liquid supplied to the mixer 76 by the first supply 74 and the processing liquid supplied to the mixer 76 by the second supply 75 is set such that the silicon concentration in the processing liquid after mixed in the mixer 76 becomes the silicon concentration in the processing liquid suitable for etching performed in the processing tank 27. Thus, each mixer 76 is capable of supplying, to the corresponding processing tank 27, the processing liquid adjusted to the silicon concentration suitable for etching performed in the processing tank 27.

Figure 7:
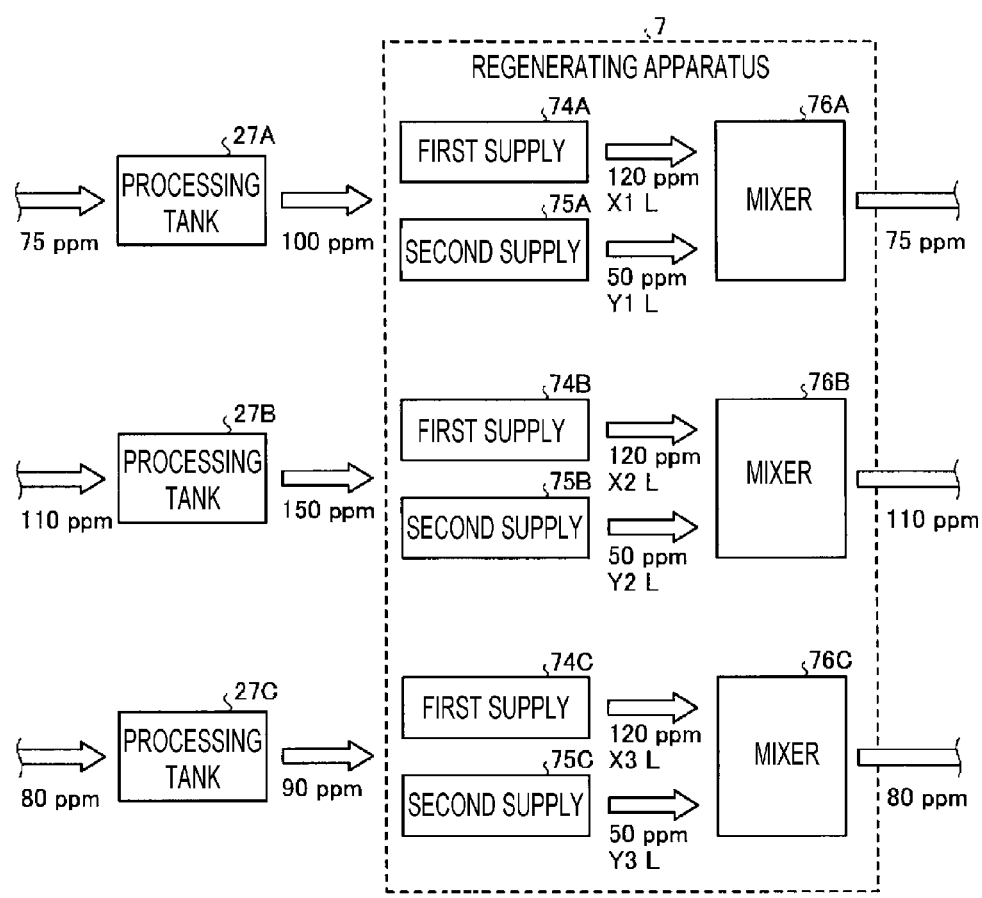
FIG. 7 is a view illustrating an exemplary regenerating processing according to the second modification in the embodiment.

This point will be described with reference to FIG. 7. FIG. 7 is a view illustrating an exemplary regenerating processing according to a second modification in the embodiment.

In FIG. 7, the three processing tanks 27 illustrated in FIG. 6 are described as processing tanks 27A to 27C, respectively. In addition, the first supplies 74, the second supplies 75, and the mixers 76 corresponding to respective processing tanks 27A to 27C are described as the first supplies 74A to 74C, the second supplies 75A to 75C, and the mixers 76A to 76C, respectively.

As illustrated in FIG. 7, here, it is assumed that the silicon concentrations of processing liquids used in the processing tanks 27A to 27C and the silicon concentrations of processing liquids recovered from the processing tanks 27A to 27C are different for each of the processing tanks 27A to 27C. Specifically, a processing liquid having a silicon concentration of 75 ppm is used in the processing tank 27A, and a processing liquid having a silicon concentration of 100 ppm is recovered from the processing tank 27A. In addition, a processing liquid having a silicon concentration of 110 ppm is used in the processing tank 27B, and a processing liquid having a silicon concentration of 150 ppm is recovered from the processing tank 27B. In addition, a processing liquid having a silicon concentration of 80 ppm is used in the processing tank 27C, and a processing liquid having a silicon concentration of 90 ppm is recovered from the processing tank 27C.

In the second modification, the reservoir 72 (see, e.g., FIG. 6) stores the processing liquid recovered from the processing tank 27A and having the silicon concentration of 100 ppm, the processing liquid recovered from the processing tank 27B and having the silicon concentration of 150 ppm, and the processing liquid recovered from the processing tank 27C and having the silicon concentration of 90 ppm. As a result, it is assumed that a processing liquid having a silicon concentration of 120 ppm is stored in the reservoir 72. In the second modification, it is assumed that the remover 73 (see, e.g., FIG. 6) reduces the silicon concentration in the processing liquid to 50 ppm by removing a portion of the silicon from the processing liquid having the silicon concentration of 120 ppm.

In addition, the controller 100 may acquire the silicon concentration in the processing liquid stored in the reservoir 72 from, for example, a concentration meter provided in the reservoir 72. In addition, the controller 100 may also acquire in advance the silicon concentration in the processing liquid stored in the reservoir 72 through, for example, a test or a simulation that is performed in advance. In addition, the controller 100 may control the remover 73 based on the silicon concentration in the processing liquid stored in the reservoir 72 such that the silicon concentration in the processing liquid after the silicon removal processing performed by the remover 73 always be a constant value (here, 50 ppm). For example, the controller 100 may acquire the silicon concentration in the processing liquid stored in the reservoir 72 from the concentration meter, and may change, for example, the processing time of the silicon removal processing in the remover 73 based on the acquired silicon concentration.

As illustrated in FIG. 7, for the first supply 74A and the second supply 75A corresponding to the processing tank 27A, the ratio of the processing liquids supplied to the mixer 76A therefrom is adjusted such that the silicon concentration in the processing liquid after mixed in the mixer 76A is 75 ppm. For example, the first supply 74A is adjusted to supply "X1" L (liters) of a processing liquid having a silicon concentration of 120 ppm, and the second supply 75A is adjusted to supply "Y1" L (liters) of a processing liquid having a silicon concentration of 50 ppm. As a result, a processing liquid having a silicon concentration of 75 ppm is generated in the mixer 76A, and the generated processing liquid having the silicon concentration of 75 ppm is supplied to the processing tank 27A through a return path 77 (see, e.g., FIG. 6).

In addition, for the first supply 74B and the second supply 75B corresponding to the processing tank 27B, the ratio of the processing liquids supplied to the mixer 76B therefrom is adjusted such that the silicon concentration in the processing liquid after mixed in the mixer 76B is 110 ppm. For example, the first supply 74B is adjusted to supply "X2" L (liters) of a processing liquid having a silicon concentration of 120 ppm, and the second supply 75B is adjusted to supply "Y2" L (liters) of a processing liquid having a silicon concentration of 50 ppm. As a result, a processing liquid having a silicon concentration of 110 ppm is generated in the mixer 76B, and the generated processing liquid having the silicon concentration of 110 ppm is supplied to the processing tank 27B through a return path 77 (see, e.g., FIG. 6).

In addition, for the first supply 74C and the second supply 75C corresponding to the processing tank 27C, the ratio of the processing liquids supplied to the mixer 76C therefrom is adjusted such that the silicon concentration in the processing liquid after mixed in the mixer 76C is 80 ppm. For example, the first supply 74C is adjusted to supply "X3" L of a processing liquid having a silicon concentration of 120 ppm, and the second supply 75C is adjusted to supply "Y3" L of a processing liquid having a silicon concentration of 50 ppm. As a result, a processing liquid having a silicon concentration of 80 ppm is generated in the mixer 76C, and the generated processing liquid having the silicon concentration of 80 ppm is supplied to the processing tank 27C through a return path 77 (see, e.g., FIG. 6).

The supply amounts of the processing liquids supplied to the mixers 76A to 76C by the first supplies 74A to 74C and the second supplies 75A to 75C may be adjusted in advance to fixed amounts determined through, for example, a test or a simulation. In addition, the supply amounts may be changed depending on the silicon concentration in the reservoir 72 measured by the concentration meter.

Figure 8:
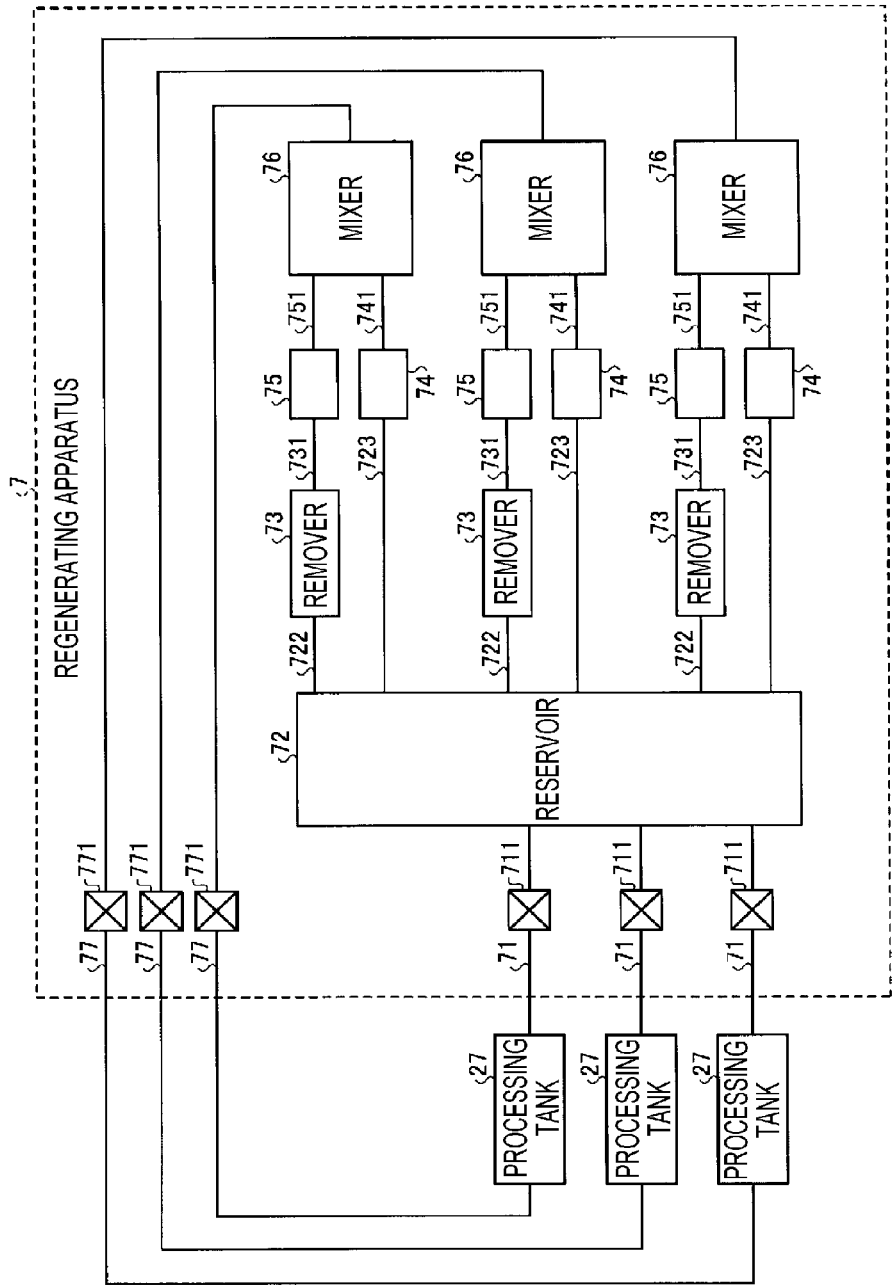
FIG. 8 is a view illustrating a configuration of a regenerating apparatus according to a third modification in the embodiment.

Next, a third modification will be described. FIG. 8 is a view illustrating a configuration of a regenerating apparatus 7 according to a third modification in the embodiment.

In the embodiment described above, an example in which the regenerating apparatus 7 includes one remover 73 for a plurality of processing tanks 27 has been described. Without being limited to this, the regenerating apparatus 7 may be provided with a plurality of removers 73 corresponding to the plurality of processing tanks 27, as illustrated in FIG. 8. Each remover 73 is connected to a single reservoir 72 through a first connection path 722. In addition, each remover 73 is connected to a second supply 75 corresponding to the same processing tank 27 among a plurality of second supplies 75 through a third connection path 731.

The processing conditions of the silicon removal processing by each remover 73 (e.g., a processing time) are determined based on, for example, the silicon concentration in the processing liquid used in the corresponding processing tank 27 and the silicon concentration in the processing liquid stored in the reservoir 72.

As described above, the regenerating apparatus 7 may include a plurality of removers 73 corresponding to a plurality of processing tanks 27.

Figure 9:
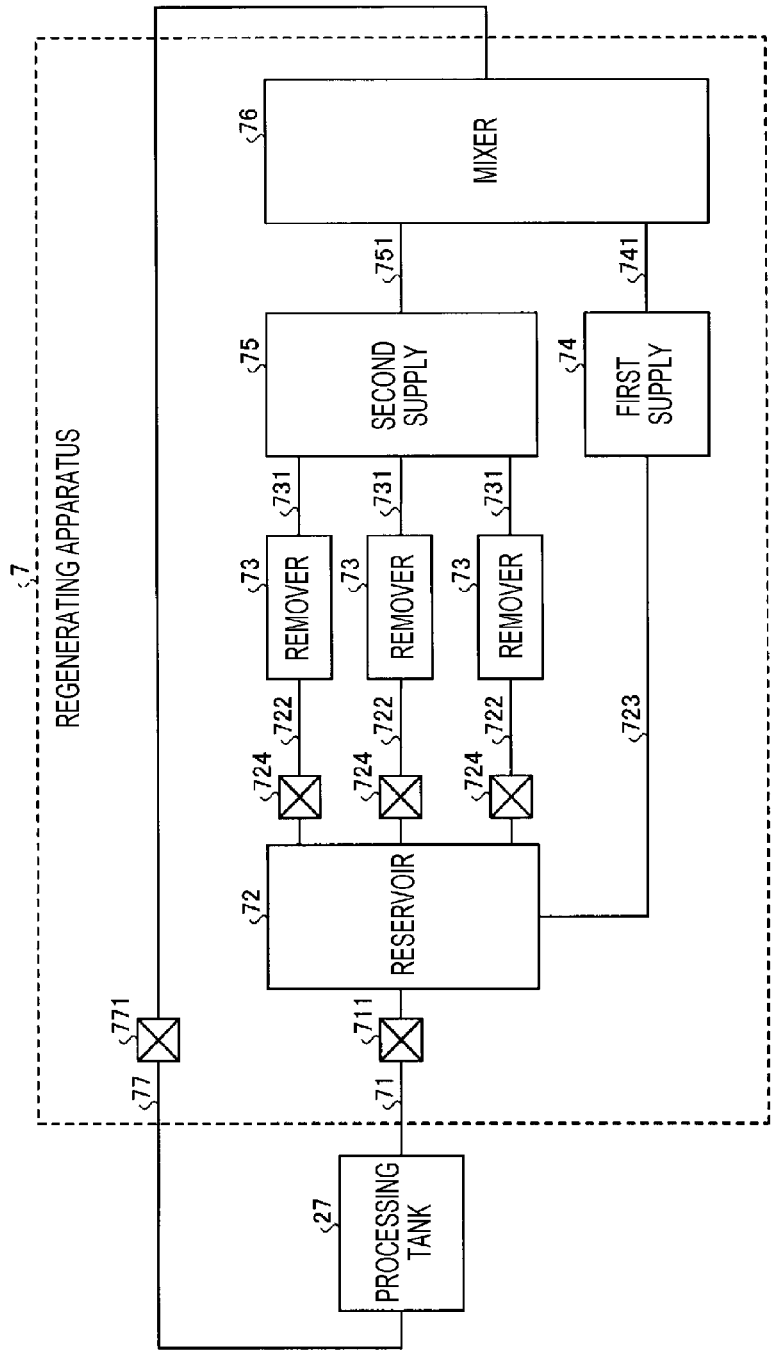
FIG. 9 is a view illustrating a configuration of a regenerating apparatus according to a fourth modification in the embodiment.

Next, a third modification will be described. FIG. 9 is a view illustrating a configuration of a regenerating apparatus 7 according to a fourth modification in the embodiment.

As illustrated in FIG. 9, the regenerating apparatus 7 may include a plurality of removers 73 corresponding to a single processing tank 27. Each remover 73 is connected to a single reservoir 72 through a first connection path 722 and an opening/closing valve 724. In addition, each remover 73 is connected to a single second supply 75 through a third connection path 731.

Figure 10:
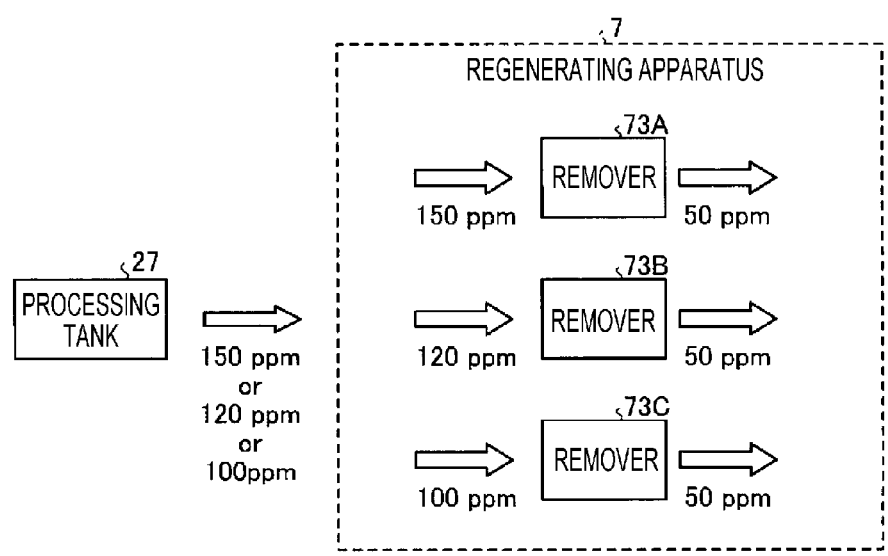
FIG. 10 is a view illustrating an exemplary regenerating processing according to the fourth modification in the embodiment.

FIG. 10 is a view illustrating an exemplary regenerating processing according to a fourth modification in the embodiment. Here, the plurality of removers 73 illustrated in FIG. 9 are respectively described as removers 73A to 73C in order to distinguish the removers.

As illustrated in FIG. 10, it is assumed that any one of a processing liquid having a silicon concentration of 150 ppm, a processing liquid having a silicon concentration of 120 ppm, and a processing liquid having a silicon concentration of 100 ppm is recovered from a single processing tank 27.

Among the removers 73A to 73C, the processing conditions of the remover 73A are predetermined such that a portion of silicon is removed from the processing liquid having the silicon concentration of 150 ppm to generate a processing liquid having a silicon concentration of 50 ppm. The processing conditions of the remover 73B are predetermined such that a portion of silicon is removed from the processing liquid having the silicon concentration of 120 ppm to generate a processing liquid having a silicon concentration of 50 ppm. The processing conditions of the remover 73C are predetermined such that a portion of silicon is removed from the processing liquid having the silicon concentration of 100 ppm to generate a processing liquid having a silicon concentration of 50 ppm.

When the silicon concentration in the processing liquid recovered from the processing tank 27 is 150 ppm, the controller 100 supplies the processing liquid having the silicon concentration of 150 ppm to the remover 73A by opening the opening/closing valve 724 corresponding to the remover 73A. This makes it possible to reduce the silicon concentration in the processing liquid from 150 ppm to 50 ppm. In addition, when the silicon concentration in the processing liquid recovered from the processing tank 27 is 120 ppm, the controller 100 supplies the processing liquid having the silicon concentration of 120 ppm to the remover 73B by opening the opening/closing valve 724 corresponding to the remover 73B. This makes it possible to reduce the silicon concentration in the processing liquid from 120 ppm to 50 ppm. In addition, when the silicon concentration in the processing liquid recovered from the processing tank 27 is 100 ppm, the controller 100 supplies the processing liquid having the silicon concentration of 100 ppm to the remover 73C by opening the opening/closing valve 724 corresponding to the remover 73C. This makes it possible to reduce the silicon concentration in the processing liquid from 100 ppm to 50 ppm.

In addition, the regenerating apparatus 7 may include two or more removers 73A, two or more removers 73B, and two or more removers 73C. This makes it possible to perform, while a silicon removal processing is performed using, for example, one remover 73A, a maintenance operation of removing silicon trapped in the other removers 73A.

As described above, the substrate processing apparatus 1 according to the embodiment includes a processing tank 27, a reservoir 72, a remover 73, a mixer 76, and a return path 77. In the processing tank 27, etching is performed on a substrate 8 by immersing the substrate 8 in a processing liquid containing a chemical liquid (e.g., a phosphoric acid aqueous solution) and silicon. The reservoir 72 recovers and stores the processing liquid discharged from the processing tank 27. The remover 73 recovers a portion of the processing liquid discharged from the processing tank 27 and removes silicon from the recovered processing liquid. The mixer 76 mixes the processing liquid stored in the reservoir 72 with the processing liquid from which silicon has been removed by the remover 73. The return path 77 returns the processing liquid mixed by the mixer 76 to the processing tank 27.

This may make it possible to reduce the amount of waste of the processing liquid compared to the method of adjusting the concentration of the processing liquid in the processing tank 27 by discarding a portion of the processing liquid in the processing tank 27 and replenishing a new processing liquid in an amount corresponding to the discarded amount to the processing tank 27, compared to a method of adjusting the concentration of the processing liquid in the processing tank 27. In addition, it is possible to regenerate the processing liquid in a short time compared to the case where the silicon removal processing by the remover 73 is performed on all the processing liquid recovered from the processing tank 27.

The substrate processing apparatus 1 according to the embodiment may include a first supply 74 and a second supply 75. The first supply 74 supplies, to the mixer 76, a first amount of the processing liquid out of the processing liquid stored in the reservoir 72. The second supply 75 supplies, to the mixer 76, a second amount of the processing liquid out of the processing liquid from which the silicon has been removed by the remover 73.

This makes it possible to supply the processing liquid stored in the reservoir 72 and the processing liquid from which silicon has been removed by the remover 73 to the mixer 76 at a predetermined ratio by the first supply 74 and the second supply 75.

In the first supply 74 and the second supply 75, the first amount and the second amount may be set based on the initial value of the silicon concentration in the processing liquid used in the processing tank 27.

This makes it possible to adjust the silicon concentration in the processing liquid recovered from the processing tank 27 to a silicon concentration suitable for etching performed in the processing tank 27, and then to return the processing liquid to the processing tank 27.

The substrate processing apparatus 1 according to the embodiment may include a plurality of processing tanks 27, a reservoir 72 configured to recover and store processing liquids discharged from the processing tanks 27, and a plurality of first supplies 74 and second supplies corresponding to the plurality of processing tanks 27. Further, the substrate processing apparatus 1 according to the embodiment may include a plurality of mixers 76 corresponding to the plurality of processing tanks 27 and connected to the first supplies 74 and second supplies 75 corresponding to the same processing tanks 27.

This makes it possible to adjust the silicon concentration in the processing liquid recovered from the processing tanks 27 to a silicon concentration suitable for each processing tank 27 and then to return the processing liquid to each of the processing tanks 27.

The substrate processing apparatus 1 according to the embodiment may include a plurality of removers 73 corresponding to a plurality of different silicon concentrations.

By providing the removers 73 corresponding to the different silicon concentrations in advance, for example, even when a plurality of types of etching are performed using the processing liquids having different silicon concentrations, there is no need to change the processing conditions of the removers 73 one by one.

The remover 73 removes a portion of silicon contained in the processing liquid from the recovered processing liquid.

This makes it possible to regenerate the processing liquid in a short time compared to the case where the silicon removal processing by the remover 73 is performed on all the processing liquid recovered from the processing tank 27.

The substrate processing apparatus 1 according to the embodiment may include a first heater (e.g., the heater 54) and a second heater (e.g., the heater 721). The first heater heats the processing liquid in the processing tank 27. The second heater heats the processing liquid in the reservoir 72.

This may make it possible to suppress the deposition of silicon in the reservoir 72 according to the temperature decrease of the processing liquid.

The substrate processing apparatus 1 according to the embodiment may include a third heater (e.g., the heater 761). The third heater heats the processing liquid in the mixer 76.

This may make it possible to suppress the deposition of silicon in the mixer 76 according to the temperature decrease of the processing liquid. In addition, when the processing liquid mixed in the mixer 76 is supplied to the processing tank 27 through the return path 77, it is possible to suppress the temperature of the processing liquid in the processing tank 27 from being lowered by the processing liquid supplied from the return path 77.

According to the present disclosure, it is possible to reduce the amount of waste of the processing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing tank configured to perform etching on a substrate disposed therein by immersing the substrate in a processing liquid containing a chemical liquid and silicon, the processing liquid having an initial silicon concentration;

a first concentration meter provided inside the processing tank, the first concentration meter configured to measure the initial silicon concentration;

a reservoir configured to recover and store the processing liquid discharged from the processing tank, the processing liquid discharged from the processing tank having a first silicon concentration higher than the initial silicon concentration;

a second concentration meter provided inside the reservoir, the second concentration meter configured to measure the first silicon concentration;

a remover configured to recover a portion of the processing liquid discharged from the processing tank and remove silicon from recovered processing liquid;

a mixer configured to mix the processing liquid received from the reservoir with the processing liquid from which silicon has been removed by the remover;

a first supply source configured to supply, to the mixer, a first amount of the processing liquid out of the processing liquid stored in the reservoir, the first amount having a same silicon concentration as the first silicon concentration;

a second supply source configured to supply, to the mixer, a second amount of the processing liquid out of the processing liquid from which silicon has been removed by the remover, the second amount having a second silicon concentration lower than the first silicon concentration;

a third concentration meter provided inside the remover, the third concentration meter configured to measure the second silicon concentration;

a return path configured to return the processing liquid from the mixer to the processing tank; and a controller configured to control an overall operation of the substrate processing apparatus, wherein the controller is programmed to:
 obtain the initial silicon concentration, the first silicon concentration, and the second silicon concentration from the respective first, second, and third concentration meters;
 calculate the first amount of the processing liquid and the second amount of the processing liquid using at least the initial silicon concentration, the first silicon concentration, and the second silicon concentration;
 control the first supply source and the second supply source to supply both the first amount of the processing liquid having the first silicon concentration to the mixer from the reservoir and the second amount of the processing liquid having the second silicon concentration to the mixer from the remover; and
 control the mixer to mix the first amount and the second amount of the processing liquid at a predetermined ratio such that an adjusted silicon concentration of the processing liquid in the mixer is the same as the initial silicon concentration.

2. The substrate processing apparatus according to claim 1, wherein, in the first supply source and the second supply source, the first amount and the second amount are set based on the initial a silicon concentration in the processing liquid.

3. The substrate processing apparatus according to claim 2, further comprising:
 a plurality of processing tanks;
 a plurality of first supply sources and a plurality of second supply sources corresponding to the plurality of processing tanks; and
 a plurality of mixers corresponding to the plurality of processing tanks, and connected to the plurality of first supply sources and the plurality of second supply sources corresponding to the plurality of processing tanks,
 wherein the reservoir is configured to recover and store the processing liquid discharged from the plurality of processing tanks.

4. The substrate processing apparatus according to claim 3, further comprising a plurality of removers corresponding to a plurality of different silicon concentrations.

5. The substrate processing apparatus according to claim 4, wherein each of the removers removes a portion of silicon contained in the processing liquid from the recovered processing liquid.

6. The substrate processing apparatus according to claim 3, further comprising:
 a first heater configured to heat the processing liquid in one of the pluralities of processing tanks; and
 a second heater configured to heat the processing liquid in the reservoir.

7. The substrate processing apparatus according to claim 6, further comprising:
 a third heater configured to heat the processing liquid in the mixer.

8. The substrate processing apparatus according to claim 1, further comprising:
 a plurality of processing tanks;
 a plurality of first supply sources and a plurality of second supply sources corresponding to the plurality of processing tanks; and
 a plurality of mixers corresponding to the plurality of processing tanks, and connected to the plurality of first supplies and the plurality of second supplies corresponding to the plurality of processing tanks,
 wherein the reservoir is configured to recover and store the processing liquid discharged from the plurality of processing tanks.

9. The substrate processing apparatus according to claim 1, further comprising a plurality of removers corresponding to a plurality of different silicon concentrations.

10. The substrate processing apparatus according to claim 1, wherein the remover removes a portion of silicon contained in the processing liquid from the recovered processing liquid.

11. The substrate processing apparatus according to claim 1, further comprising:
 a first heater configured to heat the processing liquid in the processing tank; and
 a second heater configured to heat the processing liquid in the reservoir.

12. The substrate processing apparatus according to claim 11, further comprising:
 a third heater configured to heat the processing liquid in the mixer.

13. The substrate processing apparatus according to claim 1 further comprising:
 a recovery path extending from the processing tank to the remover; and
 a branch path connecting the recovery path to the reservoir.

* * * * *